(12) United States Patent
Pasotti et al.

(10) Patent No.: US 7,885,116 B2
(45) Date of Patent: *Feb. 8, 2011

(54) SENSE AMPLIFIER FOR LOW-SUPPLY-VOLTAGE NONVOLATILE MEMORY CELLS

(76) Inventors: Marco Pasotti, Via Benedetto Croce, 3, S. Martino Siccomario (IT) 27028; Guido De Sandre, Via Volturno, 80 - Fiori, Brugherio (IT) 20047; David Iezzi, Via Crocifisso, 17, Osnago (IT) 23875; Marco Poles, via Fratelli Cervi, 42, Ghedi (IT) 25016

(*) Notice: Subject to any disclaimer, the term of this patent is extended or adjusted under 35 U.S.C. 154(b) by 0 days.

This patent is subject to a terminal disclaimer.

(21) Appl. No.: 12/368,271

(22) Filed: Feb. 9, 2009

(65) Prior Publication Data
US 2009/0154249 A1 Jun. 18, 2009

Related U.S. Application Data

(63) Continuation of application No. 10/777,457, filed on Feb. 12, 2004, now Pat. No. 7,508,716.

(30) Foreign Application Priority Data
Feb. 18, 2003 (IT) .......................... TO2003A0121

(51) Int. Cl.
G11C 11/34 (2006.01)
G11C 7/02 (2006.01)

(52) U.S. Cl. .............................. 365/185.18; 365/185.2; 365/185.21; 365/210.1; 365/210.15

(58) Field of Classification Search ............. 365/185.2, 365/185.21, 210, 185.18, 210.1, 210.15
See application file for complete search history.

(56) References Cited

U.S. PATENT DOCUMENTS

| | | | |
|---|---|---|---|
| 4,648,074 | A | 3/1987 | Pollachek |
| 5,717,640 | A | 2/1998 | Hashimoto |
| 5,859,798 | A | 1/1999 | Yero |
| 5,909,405 | A | 6/1999 | Lee et al. |
| 5,973,959 | A | 10/1999 | Gerna et al. |
| 6,097,633 | A | 8/2000 | La Placa |
| 6,320,808 | B1 | 11/2001 | Conte et al. |
| 6,445,616 | B2 | 9/2002 | Kim |
| 6,532,174 | B2 | 3/2003 | Homma et al. |
| 6,535,428 | B2 | 3/2003 | Pasotti et al. |
| 6,621,729 | B1 | 9/2003 | Garni et al. |

*Primary Examiner*—Trong Phan
(74) *Attorney, Agent, or Firm*—Schwabe Williamson & Wyatt

(57) ABSTRACT

A sense amplifier for nonvolatile memory cells includes a reference cell, a first load, connected to the reference cell, and a second load, connectable to a nonvolatile memory cell, both the first load and the second load having controllable resistance; a control circuit of the first load and of the second load supplies the first load and the second load with a control voltage irrespective of an operating voltage between a first conduction terminal and a second conduction terminal of the first load.

16 Claims, 2 Drawing Sheets

SENSE AMPLIFIER FOR LOW-SUPPLY-VOLTAGE NONVOLATILE MEMORY CELLS

CROSS-REFERENCE TO RELATED APPLICATIONS

The present application is a continuation of U.S. patent application Ser. No. 10/777,457, filed Feb. 12, 2004, entitled "Sense Amplifier for Low-Supply-Voltage Nonvolatile Memory Cells," which claims priority to Italian Patent Application No. TO2003A000121, filed Feb. 18, 2003, both of which are hereby incorporated by reference in their entirety for all purposes except for those sections, if any, that are inconsistent with the present application.

BACKGROUND OF THE INVENTION

1. Field of the Invention

The present invention relates to a sense amplifier for low-supply-voltage nonvolatile memory cells.

2. Discussion of the Related Art

As is known, the reading of nonvolatile memory cells is normally based upon the comparison between the currents flowing through a selected memory cell (cell to be read) and a reference memory cell, biased with equal gate-source and drain-source voltages.

In practice, in known sense-amplifier circuits, the cell to be read and the reference memory cell are coupled to respective load transistors, which are connected to one another in a current-mirror configuration and hence have equal gate-source voltage. The currents flowing in the cells are thus converted into voltages, which are then directly compared by a comparator circuit having inputs connected to the drain terminals of the load transistors.

The traditional architecture in a current-mirror configuration, typically used for connection between the load transistors, limits, however, the performance of the known sense-amplifier circuits and, above all, causes their use to be critical in presence of low supply voltages.

In fact, in order to conduct a sufficient current, the load transistors must have a gate-source conduction voltage that is equal, in absolute value, to the sum of a threshold voltage and a so-called overdrive voltage. With reference to the typical case of load transistors of a PMOS type, with source terminals connected to a supply line, in both of the load transistors the gate terminal must be at a voltage lower than the supply voltage by an amount equal to the conduction voltage.

Furthermore, one of the load transistors (normally the one associated with the reference cell) is diode connected, i.e., it has drain and source terminals directly connected to one another. It is thus evident that also the drain terminal is biased at a voltage equal to the supply voltage decreased by the conduction voltage.

Such a constraint, however, is scarcely compatible with the supply voltages currently used and, above all, conflicts with the need, which is increasingly felt, to reduce the supply voltages in order to minimize power consumption. The voltage on the gate terminal of the load transistors must in fact be sufficient to guarantee correct operation also of the cell to be read and, in particular, of the reference cell, which is in the most critical condition. Furthermore, also other components, which are normally cascaded between the drain terminal of the load transistor and the reference cell, must be biased with a sufficient voltage. In particular, there are usually provided a stage for regulating the drain voltage of the reference cell; and so-called "dummy" transistors, which reproduce on the side of the reference cell the effect of the column-decoder circuits.

As an example, consider a sense amplifier which receives a supply voltage of 1.8 V and is provided with a load transistor having a threshold voltage of 0.5 V and operating with an overdrive voltage of 0.3 V. In this case, the gate-source conduction voltage is equal to approximately 0.8 V, and thus the drain terminal of the diode-connected load transistor is at approximately 1 V, i.e., at the border of proper operation conditions. It is evident that even modest disturbances or thermal variations can readily cause malfunctioning.

SUMMARY OF THE INVENTION

One aim of the present invention is to provide a sense amplifier that is free from the drawbacks described above. According to the present invention, a sense amplifier for low-supply-voltage nonvolatile memory cells is provided, comprising a reference cell, a first load, connected to said reference cell, and a second load, connectable to a nonvolatile memory cell, said first load and said second load each having a controllable resistance a control circuit controlling said first load and said second load and feeding said first load and said second load with a control voltage independent of an operating voltage between a first conduction terminal and a second conduction terminal of said first load.

According to an embodiment of the present invention, said control circuit comprises a feedback amplifier, connected to said first load, for controlling a voltage on said first conduction terminal.

According to an embodiment of the present invention, said feedback amplifier has a first input connected to said first conduction terminal of said first load, a second input connected to a voltage generator and supplying a constant reference voltage, and an output, connected to a control terminal of said first load.

According to an embodiment of the present invention, said first conduction terminal and said second conduction terminal of said first load are connected to said reference cell and, respectively, to a supply line, providing a supply voltage.

According to an embodiment of the present invention, said second load has a first conduction terminal, connectable to said memory cell, and a second conduction terminal, connected to said supply line.

According to an embodiment of the present invention, said first load and said second load comprise respective PMOS transistors and in that said respective first conduction terminals are drain terminals and said respective second conduction terminals are source terminals.

According to an embodiment of the present invention, said output of said feedback amplifier is connected to a control terminal of said second load.

According to another embodiment, there is provided a sense amplifier comprising a first voltage limiter connected between said first load and said reference cell, for maintaining a drain terminal of said reference cell at a pre-determined voltage, and a second voltage limiter connectable between said second load and said memory cell for maintaining a drain terminal of said reference cell at said pre-determined voltage.

According to an embodiment of the present invention, said first conduction terminal of said first load is directly connected to said reference cell, and said first conduction terminal of said second load is directly connectable to said memory cell.

According to an embodiment of the present invention, a sense amplifier comprising a voltage-regulator circuit associated to said first load for maintaining said first conduction terminal of said second load at a pre-set voltage.

According to an embodiment of the present invention, a sense amplifier comprising a comparator circuit having a first input and a second input connected to said first load and to said second load, respectively, and an output, supplying a signal correlated to a datum stored in said memory cell.

According to an embodiment of the present invention, a nonvolatile memory comprising a plurality of memory cells and a read/write circuit, selectively connectable to said memory cells; wherein said read/write circuit comprises a plurality of sense amplifiers.

BRIEF DESCRIPTION OF THE DRAWINGS

For a better understanding of the invention, some embodiments thereof are now described, purely by way of non-limiting example and with reference to the attached drawings, in which.

DETAILED DESCRIPTION

Figure 1:
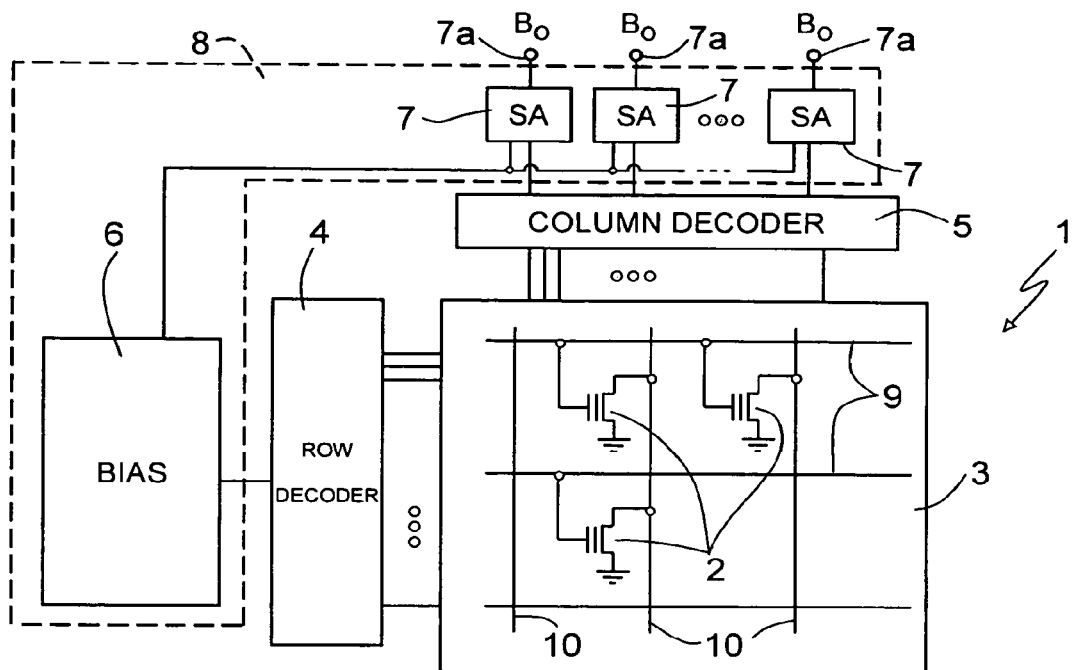
FIG. 1 illustrates a simplified circuit diagram of a nonvolatile storage device.

With reference to FIG. 1, a nonvolatile storage device, designated as a whole by 1, comprises a plurality of memory cells 2, arranged in rows and columns so as to form a memory array 3; a row decoder 4; a column decoder 5; and a read/write circuit 8, which has a biasing circuit 6 and a plurality of sense amplifiers 7.

In particular, memory cells 2 belonging to the same row have respective gate terminals connected to the row decoder 4 through the same wordline 9, and memory cells 2 belonging to the same column have respective drain terminals connected to the column decoder 5 through the same bitline 10.

The row decoder 4, in a known way, selects a wordline 9 and connects it to an output of the biasing circuit 6, while the column decoder 5 selects a preset number of bitlines 10 and connects them to respective sense amplifiers 7.

The output of the biasing circuit 6 is connected both to the row decoder 4, as mentioned, and to the sense amplifiers 7, and supplies, in a per se known manner, appropriate read and write voltages. In particular, during read or verify, the output of the biasing circuit 6 supplies a read voltage $V_{WL}$ to the wordline 10 selected by the row decoder 4 and to the sense amplifiers 7.

The sense amplifiers 7 have respective outputs 7a, which supply respective output signals $B_O$, correlated to the data stored in the memory cells 2 selected for reading.

Figure 2:
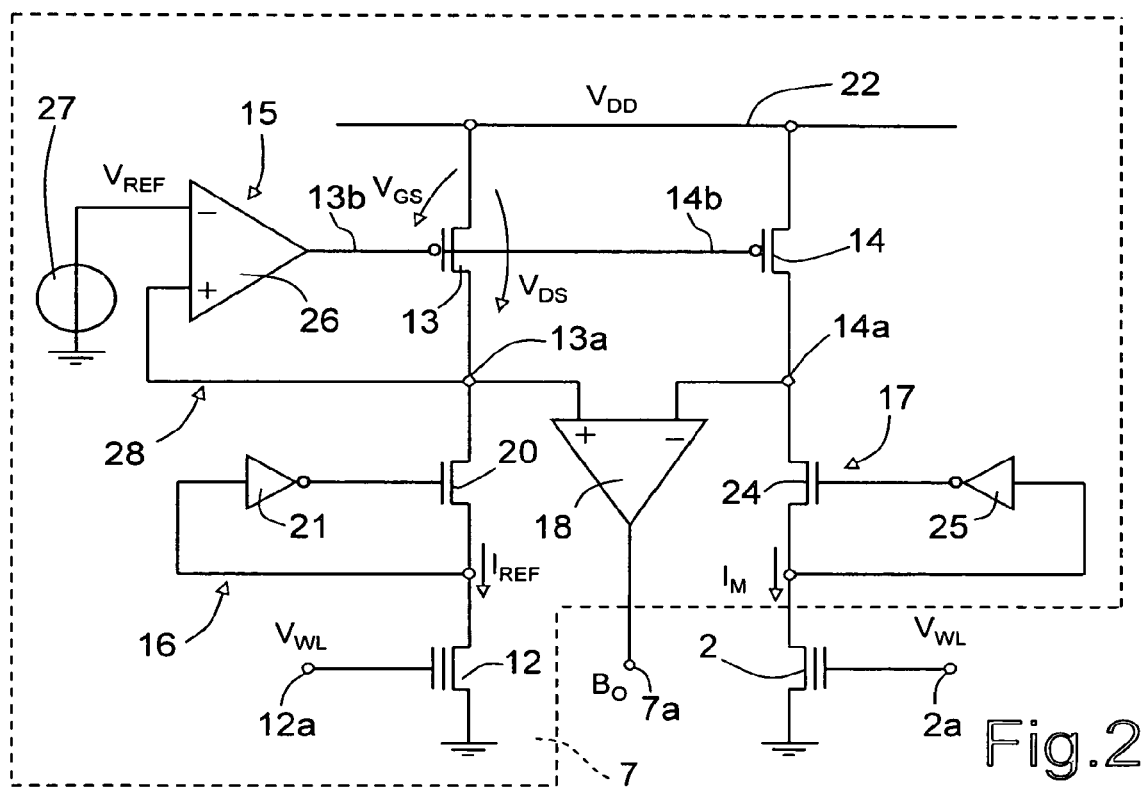
FIG. 2 illustrates a more detailed circuit diagram of a sense-amplifier circuit according to a first embodiment of the present invention.

The structure of the sense amplifiers 7 is illustrated in greater detail in FIG. 2. In particular, each sense amplifier 7 comprises a reference cell 12, identical to the memory cells 2, a reference active load 13, an array active load 14, a control circuit 15 for load control, a first voltage limiter 16 and a second voltage limiter 17, and a comparator 18.

The reference cell 12 and the reference active load 13 are connected to one another via the first voltage limiter 16.

More precisely, the reference cell 12 has source terminal connected to ground and gate terminal 12a connected to the output of the biasing circuit 6 (herein not shown), so as to receive the read voltage $V_{WL}$.

The first voltage limiter 16, which is preferably a "cascode" type stage, comprises a first limiting transistor 20, of NMOS type, having a source terminal connected to the gate terminal through a first inverter 21, which has a predetermined switching voltage (for example, 0.8 V). The source terminal of the first limiting transistor 20 is moreover connected to the drain terminal of the reference cell 12, which is thus a low-impedance node.

The reference active load 13 and the array active load 14 are preferably PMOS transistors that are identical to one another. In particular, the reference active load 13 and the array active load 14 have respective gate terminals connected to the control circuit 15, as clarified hereinafter, and respective source terminals connected to a supply line 22, supplying a supply voltage $V_{DD}$ of, for example, 1.5 V. Furthermore, the drain terminal 13a of the reference active load 13 is connected to the drain terminal of the first limiting transistor 20, while the array active load has drain terminal 14a connected to the second voltage limiter 17.

Also the second voltage limiter 17 is a "cascode" stage comprising a second limiting transistor 24, identical to the first limiting transistor 20. In particular, the second limiting transistor 24 has drain terminal connected to the drain terminal 14a of the array active load 14 and source terminal connected to the gate terminal via a second inverter 25, which has the same switching voltage as the first inverter 21. Furthermore, the source terminal of the second limiting transistor 24 is connected to the drain terminal of a memory cell 2 selected for reading, through the column decoder 5 (not illustrated herein for reasons of simplicity). Obviously, the memory cell 2 selected has gate terminal 2a connected, through a respective wordline 9, to the biasing circuit 6 and hence receives the read voltage $V_{WL}$.

In practice, the reference cell 12, the first voltage limiter 16, and the reference active load 13 form a reference branch, through which a reference current $I_{REF}$ flows. Likewise, the memory cell 2 selected, the second voltage limiter 17, and the array active load form an array branch, in which an array current $I_M$ flows, which depends upon the threshold voltage of the memory cell 2, i.e., upon the data stored therein.

The control circuit 15 comprises a differential amplifier 26 having a non-inverting input connected to the drain terminal 13a of the reference active load 13, an inverting input connected to a voltage generator 27, which supplies a reference voltage $V_{REF}$, and an output, connected to the gate terminals 13b, 14b of the reference active load 13 and of the array active load 14, respectively. The differential amplifier 26 and the reference active load 13 thus form a feedback loop 28, which maintains the drain terminal 13a of the array active load 13 at a voltage equal to the reference voltage $V_{REF}$. Preferably, moreover, the reference voltage $V_{REF}$ is a band-gap voltage, which is independent of the supply voltage $V_{DD}$ (with the sole constraint of being lower) and of the temperature, and is between 1 V and 1.3 V (for example, the reference voltage $V_{REF}$ is 1.1 V).

The comparator 18 has a non-inverting input and an inverting input connected to the drain terminal 13a of the reference active load 13 and, respectively, to the drain terminal 14a of the array active load 14; an output of the comparator 18 forms the output 7a of the sense amplifier 7 and supplies the corresponding output signal $B_O$.

Operation of the sense amplifier 7 is described hereinafter.

In the read step, the selected memory cell 2 and the reference cell 12 receive at their respective gate terminals 2a, 12a the read voltage $V_{WL}$ and are consequently in condition to conduct current. Furthermore, the voltage limiters 16, 17 maintain the drain terminals of the selected memory cell 2 and of the reference cell 12 at a pre-determined voltage, substantially equal to the switching voltage of the inverters 21, 25 (in this case 0.8 V). In fact, when the switching voltage is exceeded either in the array branch or the reference branch, the corresponding inverter 21, 25 tends to switch, lowering the voltage on the gate terminal of the respective limiting transistor 20, 24.

The control circuit 15 drives the reference load 13 so as to maintain the drain terminal 13a of the latter, which is connected to the non-inverting input of the differential amplifier 26, basically at the reference voltage $V_{REF}$. In other words, the differential amplifier 26 controls the gate-source voltage $V_{GS}$ of the reference active load 13 so as to maintain substantially its inverting and non-inverting inputs at the same voltage, while the reference current $I_{REF}$ flows through the reference active load 13. Consequently, the voltage on the drain terminal 13a of the reference active load 13 remains fixed at a pre-determined value (equal to the reference voltage $V_{REF}$) irrespective of the value of the gate-source voltage $V_{GS}$. More precisely, the gate-source voltage $V_{GS}$ is independent of the drain-source voltage $V_{DS}$ across the drain terminal 13a and the source terminal of the reference active load 13. In practice, the gate terminal of the reference active load 13 can drop to a lower voltage than the drain terminal 13a. Hence, on the one hand, the gate-source voltage $V_{GS}$ enables the reference current $I_{REF}$ flowing through the reference load 13 and the reference cell 12 and, on the other hand, the drain terminal 13a of the reference active load 13 is maintained at a voltage sufficiently high as to guarantee the correct biasing both of the limiting transistor 20 and of the reference cell 12. By way of example, considering for the reference active load 13 a threshold voltage of 0.5 V and an overdrive voltage of 0.3 V, the gate-source voltage $V_{GS}$ is, in absolute value, 0.8 V; consequently, the gate terminal of the reference active load 13 is at a voltage equal to $V_{DD}-|V_{GS}|=1.5-0.8=0.7$ V, whereas the drain terminal 13a, as already clarified, is at the reference voltage $V_{REF}$ (in this case 1.1 V).

Clearly, since the reference active load 13 and the array active load 14 are identical to one another and are biased with the same gate-source voltage $V_{GS}$, they also have substantially equal output resistances. Consequently, the difference between the reference current $I_{REF}$ and the array current $I_M$ and the difference between the voltages on the drain terminals 13a, 14a of the reference active load 13 and of the array active load 14 depend only upon the difference between the threshold voltages of the reference cell 12 and of the selected array cell 2, respectively. Consequently, the value of the output signal $B_O$ supplied by the comparator 18 is indicative of the data stored in the selected memory cell 2.

The advantages of the invention are clear from the above description. In the first place, the control circuit 15 makes it possible to decouple the gate and drain terminals of the reference active load 13. Consequently, the drain terminal of the array active load 13 can be maintained at a voltage very close to the supply voltage $V_{DD}$, in any case ensuring current conduction, even when the gate terminal is to be biased at a considerably lower voltage. In practice, this means that the sense amplifier 7 can operate correctly and with high precision even with low supply voltages, such as, precisely, 1.5 V.

Furthermore, the use of the control circuit 15 is advantageous also during charge transients of the bitlines 10, in the initial steps of the reading operations. In this case, in fact, the differential amplifier 26 imposes on the gate terminals of the active loads 13, 14 voltages close to 0 V. The active loads 13, 14 can thus conduct high currents and consequently the bitlines 10 and possible parasitic capacitances are charged rapidly.

Figure 3:
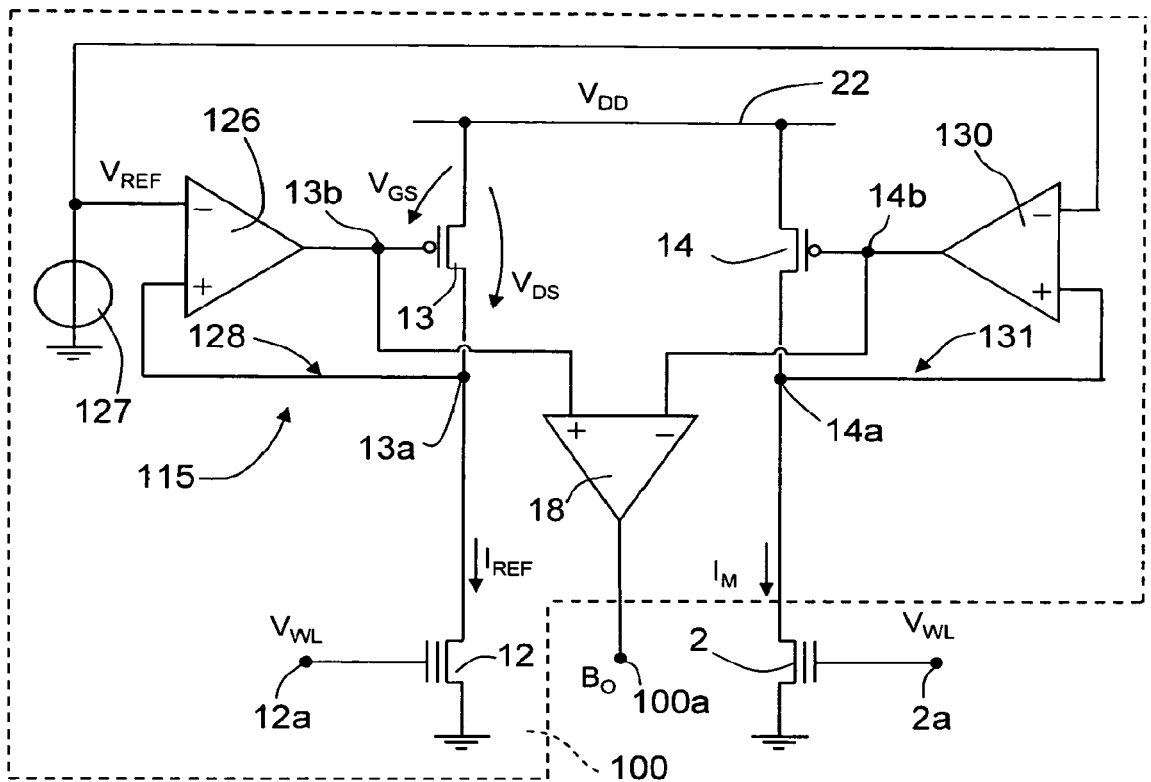
FIG. 3 illustrates a more detailed circuit diagram of a sense-amplifier circuit in a second embodiment of the present invention.

A second embodiment of the invention will be hereinafter described with reference to FIG. 3, in which parts that are the same as those already described are designated by the same reference numbers. In particular, a sense amplifier 100 comprises: the reference cell 12, which is identical to the memory cells 2; the reference active load 13; the array active load 14; a control circuit 115 for controlling the loads; and the comparator 18, which in this case has non-inverting input connected to the gate terminal 13b of the reference active load 13, inverting input connected to the gate terminal 14b of the array active load 14, and output forming an output 100a of the sense amplifier 100. In addition, the supply line 22 provides a supply voltage $V_{DD}$ of 1 V. In this case, the drain terminals of the reference cell 12 and of the memory cell 2 are directly connected to the drain terminals 13a, 14a of the reference active load 13 and of the array active load 14, respectively, in practice without interposition of the voltage limiters. Furthermore, the load-control circuit 115 comprises: a first differential amplifier 126, having a non-inverting input connected to the drain terminal 13a of the reference active load 13, an inverting input connected to a voltage generator 127, supplying a reference voltage $V_{REF}$, and an output, connected to the gate terminal 13b of the reference active load 13; and a second differential amplifier 130, having a non-inverting input connected to the drain terminal 14a of the array active load 14, an inverting input connected to the voltage generator 127, and an output, connected to the gate terminal 14b of the array active load 14. The first differential amplifier 126 and the reference active load 13 form a first feedback loop 128 that controls the gate-source voltage $V_{GS}$ and regulates the voltage on the drain terminal 13a of the reference active load 13 at the reference voltage $V_{REF}$. Likewise, the second differential amplifier 130 and the array active load 14 form a second feedback loop 131 that regulates the voltage on the drain terminal 14a of the array active load 14 at the reference voltage $V_{REF}$.

In this way, the need for the voltage limiters is overcome, the function whereof is, in practice, performed by the feedback loops 128, 131; thus the sense amplifier 100 is suitable for operating with particularly low supply voltages, such as, for example, 1 V.

Finally, it is clear that modifications and variations may be made to the sense amplifier described herein, without thereby departing from the scope of the present invention.

For example, in the sense amplifier 7 of FIG. 2, between the first voltage limiter 16 and the drain terminal of the reference cell 12 one or more "dummy" transistors could be provided, which are always biased so as to conduct. These transistors counterbalance the presence of the column decoder 5 between the memory cell 2 selected and the second voltage limiter 17, and are used for balancing the reference branch with respect to the array branch.

Furthermore, to optimize performance in terms of stability and speed of response, it is possible to compensate the sense amplifier. For example, it is possible to connect a compensation capacitor between the drain terminal of the reference active load and ground, possibly with a compensation resistor set in series; alternatively, there can be carried out a Miller-type compensation, using a compensation capacitor connected between the drain and gate terminals of the reference active load.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A nonvolatile storage device comprising:
   a plurality of memory cells; and
   a sense amplifier including:
      a first load coupled in series with a reference cell, between the reference memory cell and a supply voltage;
      a second load selectively connectable to at least one memory cell of the plurality of memory cells; and
      a control circuit configured to apply a control voltage to the first load and the second load, independent of an operating voltage across the first load, and in response to a voltage at a node between the first load and the reference cell to provide a reading current to the reference cell during a reading of the at least one memory cell.

2. The device of claim 1, wherein the control circuit comprises a feedback amplifier including an output connected to a control terminal of the first load for controlling a voltage at the node between the first load and the reference cell.

3. The device of claim 2, wherein the feedback amplifier has a first input connected to the node between the first load and the reference cell, and a second input connectable to a voltage generator.

4. The device of claim 2, wherein the output of the feedback amplifier is connected to a control terminal of the second load for controlling a voltage at a node between the second load and the at least one memory cell.

5. The device of claim 1, wherein the control circuit comprises a first feedback amplifier including an output connected to a control terminal of the first load for controlling a voltage at the node between the first load and the reference cell, and wherein the control circuit further comprises a second feedback amplifier including an output connected to a control terminal of the second load for controlling a voltage at a node between the second load and the at least one memory cell.

6. The device of claim 5, wherein the sense amplifier further includes a comparator configured to output a signal representative of data stored in the at least one memory cell, and wherein the comparator has a first input connected to the output of first feedback amplifier, and a second input connected to the output of the second feedback amplifier.

7. The device of claim 1, wherein the sense amplifier further includes a comparator configured to output a signal representative of data stored in the at least one memory cell, and wherein the comparator has a first input connected to the node between the first load and the reference cell, and a second input connected to a node between the second load and the at least one memory cell.

8. The device of claim 1, wherein the second load is coupled in series with the at least one memory cell, between the at least one memory cell and the supply voltage.

9. The device of claim 1, wherein the sense amplifier further includes a voltage limiter connected between the node and the reference cell for maintaining a drain terminal of the reference cell at a pre-determined voltage.

10. The device of claim 1, wherein the sense amplifier further includes a voltage limiter connectable between the second load and the memory cell for maintaining a drain terminal of the reference cell at a pre-determined voltage.

11. The device of claim 1, wherein the first load comprises a first transistor having a first conducting terminal coupled to the reference memory cell and a second conducting terminal connectable to the supply voltage, and wherein the second load comprises a second transistor.

12. The device of claim 1, further comprising a plurality of other sense amplifiers similarly constituted to the sense amplifier.

13. A method comprising:
   providing a first load coupled in series with a reference cell, between the reference memory cell and a supply voltage;
   providing a second load selectively connectable to at least one memory cell of the plurality of memory cells; and
   applying a control voltage to a first load and a second load, independent of an operating voltage across the first load, and in response to a voltage at a node between the first load and the reference cell to provide a reading current to the reference cell during a reading of the at least one memory cell.

14. The method of claim 13, wherein the applying a control voltage comprises maintaining a drain terminal of the first load at the control voltage.

15. The method of claim 13, further comprising comparing the voltage at the node between the first load and the reference cell with a voltage at a node between the second load and the memory cell.

16. The method of claim 13, further comprising outputting a signal indicative of the difference between a voltage at a node between the first load and the reference cell with a voltage at a node between the second load and the memory cell.

* * * * *